United States Patent
Kadlimatti et al.

(10) Patent No.: US 12,366,876 B2
(45) Date of Patent: Jul. 22, 2025

(54) VOLTAGE GLITCH DETECTOR

(71) Applicant: Texas Instruments Incorporated, Dallas, TX (US)

(72) Inventors: Venkatesh Kadlimatti, Sivasagar (IN); Aritra Chowdhury, Bangalore (IN); Harikrishna P, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 278 days.

(21) Appl. No.: 18/309,340

(22) Filed: Apr. 28, 2023

(65) Prior Publication Data
US 2024/0361794 A1    Oct. 31, 2024

(51) Int. Cl.
G05F 3/24    (2006.01)
G05F 1/565   (2006.01)
G05F 3/26    (2006.01)

(52) U.S. Cl.
CPC .............. G05F 3/247 (2013.01); G05F 1/565 (2013.01); G05F 3/262 (2013.01)

(58) Field of Classification Search
CPC ........... G05F 3/247; G05F 3/262; G05F 1/565
USPC ......................................................... 323/312
See application file for complete search history.

(56) References Cited

U.S. PATENT DOCUMENTS

| | | | |
|---|---|---|---|
| 6,614,291 B1 * | 9/2003 | Zhao ............... | H03K 3/012 326/115 |
| 2018/0348264 A1 * | 12/2018 | Kuo ................. | G01R 19/16552 |
| 2021/0004501 A1 * | 1/2021 | Xue ................. | G06F 21/755 |

* cited by examiner

*Primary Examiner* — Yemane Mehari
(74) *Attorney, Agent, or Firm* — Brian D. Graham; Frank D. Cimino (57) ABSTRACT

In described examples, a voltage glitch detector includes a current source, a latch, and first, second, third, fourth, and fifth transistors. A source of the third transistor is coupled to a source of the second transistor, and a gate and drain of the third transistor is coupled to gates of the first and second transistors and a first terminal of the current source. A drain of the fourth transistor is coupled to a drain of the first transistor and an input of the latch. A source of the fifth transistor is coupled to a source of the fourth transistor and the second terminal of the current source. A gate and drain of the fifth transistor is coupled to a gate of the fourth transistor and a drain of the second transistor.

20 Claims, 7 Drawing Sheets

VOLTAGE GLITCH DETECTOR

TECHNICAL FIELD

This application relates generally to voltage glitch detection, and more particularly to detection of a voltage glitch in a supply voltage.

BACKGROUND

In some examples, variation of a supply voltage outside of designed operation limits—a supply voltage glitch—can cause unpredictable or otherwise unreliable downstream circuit behavior. Deliberately introduced supply voltage glitches have been used as a fault injection method to attack mixed-signal electronic circuits, such as microcontroller units (MCUs) in internet-of-things (IoT) and other-application devices. In some examples, these attacks have been used to cause a firmware boot process to skip or bypass commands corresponding to cryptographic or other security checks. This may cause an MCU or other device subject to hostile physical access to be vulnerable to data breach or other undesirable hacking.

SUMMARY

In described examples, a voltage glitch detector includes a current source, a latch, and first, second, third, fourth, and fifth transistors. A source of the third transistor is coupled to a source of the second transistor, and a gate and drain of the third transistor is coupled to gates of the first and second transistors and a first terminal of the current source. A drain of the fourth transistor is coupled to a drain of the first transistor and an input of the latch. A source of the fifth transistor is coupled to a source of the fourth transistor and the second terminal of the current source. A gate and drain of the fifth transistor is coupled to a gate of the fourth transistor and a drain of the second transistor.

DETAILED DESCRIPTION

Figure 1:
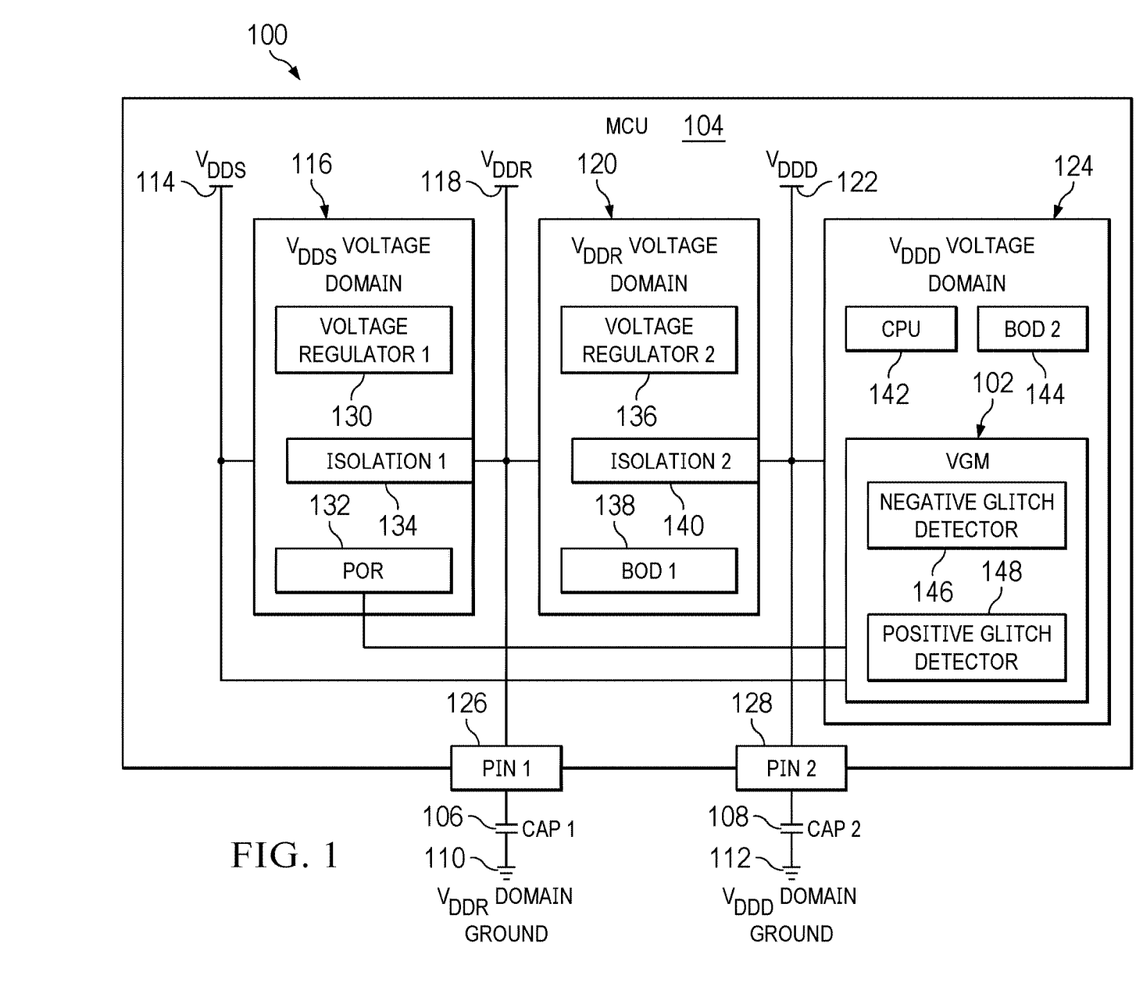
FIG. 1 is a circuit diagram of an example microcontroller unit (MCU) including a voltage glitch detection module (VGM).

FIG. 1 is a circuit diagram of an example microcontroller unit (MCU) system 100 including a voltage glitch detection module (VGM) 102. The MCU system 100 includes an MCU 104, a first capacitor (cap 1) 106, a second capacitor (cap 2) 108, a $V_{DDR}$ domain ground 110, and a $V_{DDD}$ domain ground 112. The MCU 104 includes a $V_{DDS}$ voltage source ($V_{DDS}$) 114 providing a voltage $V_{DDS}$, a $V_{DDS}$ voltage domain 116, a $V_{DDR}$ voltage source ($V_{DDR}$) 118 providing a voltage $V_{DDR}$, a $V_{DDR}$ voltage domain 120, a $V_{DDD}$ voltage source ($V_{DDD}$) 122 providing a voltage $V_{DDD}$, a $V_{DDD}$ voltage domain 124, a first pin (pin 1) 126, and a second pin (pin 2) 128.

The $V_{DDS}$ voltage domain 116 includes a first voltage regulator (voltage regulator 1) 130 (or multiple voltage regulators), a power on reset (POR) logic 132, and a first isolation (isolation 1) 134. The $V_{DDR}$ voltage domain 120 includes a second voltage regulator (voltage regulator 2) 136 (or multiple voltage regulators), a first brown out detector (BOD 1) 138, and a second isolation (isolation 2) 140. The $V_{DDD}$ voltage domain 124 includes a central processing unit (CPU) 142, a second brown out detector (BOD 2) 144, and the VGM 102. The VGM 102 includes a negative glitch detector 146, which is configured to detect transient voltages below an intended supply voltage (negative voltage glitches), and a positive glitch detector 148, which is configured to detect transient voltages above an intended supply voltage (positive voltage glitches).

$V_{DDS}$ 114 is connected to the $V_{DDS}$ voltage domain 116 and to the VGM 102. The VGM 102 is also connected to output to the POR 132 (or in some examples, another security circuit) in the $V_{DDS}$ voltage domain 116. The $V_{DDS}$ voltage domain 116 is connected to $V_{DDR}$ 118, pin 1 126, and the $V_{DDR}$ voltage domain 120 via isolation 1 134. Pin 1 126 is connected to a first terminal of cap 1 106, and a second terminal of cap 1 106 is connected to the $V_{DDR}$ domain ground 110. The $V_{DDR}$ voltage domain 120 is connected to $V_{DDD}$ 122, pin 2 128, and the $V_{DDD}$ voltage domain 124 via isolation 2 140. Pin 2 128 is connected to a first terminal of cap 2 108, and a second terminal of cap 2 108 is connected to the $V_{DDD}$ domain ground 112.

$V_{DDS}$ 114 is a physical power source, such as a coin cell or other battery providing direct current (DC) power. $V_{DDR}$ 118 is a step-down voltage source derived from $V_{DDS}$ 114 using voltage regulator 1 130, and $V_{DDD}$ 122 is a step-down voltage source derived from $V_{DDR}$ 118—accordingly, indirectly from $V_{DDS}$ 114—using voltage regulator 2 136. This means that $V_{DDR}$ 118 is a lower voltage domain that $V_{DDS}$ 114, and $V_{DDD}$ 122 is a lower voltage domain than $V_{DDR}$ 118. In some examples, relatively lower voltages can be used to enable faster, smaller circuits, such as in the CPU 142. Voltage regulator 1 130 and voltage regulator 2 136 are, for example, low dropout voltage regulators or other DC-DC voltage regulators. Isolation 1 134 and isolation 2 140 isolate different voltage domains from each other.

In some examples, an attacker uses a supply voltage glitch to attack CPU 142 behavior by removing cap 2 108 and injecting a voltage spike at pin 2 128. This can cause transient errors in $V_{DDD}$ 122, which can in turn disrupt the ability of the CPU 142 to comply with reliable, secure behavior. In some examples, if the VGM 102 detects a positive voltage glitch or a negative voltage glitch (also referred to, respectively, as a positive glitch or a negative glitch), it triggers the POR 132 to reset the MCU 104 so that if the voltage glitch is part of an attack, unauthorized commands applied with the attack will be discarded. In some examples, an indication of a positive glitch or a negative glitch can also trigger a security function or security action of the MCU 104 other than or in addition to a POR 132.

Figure 2:
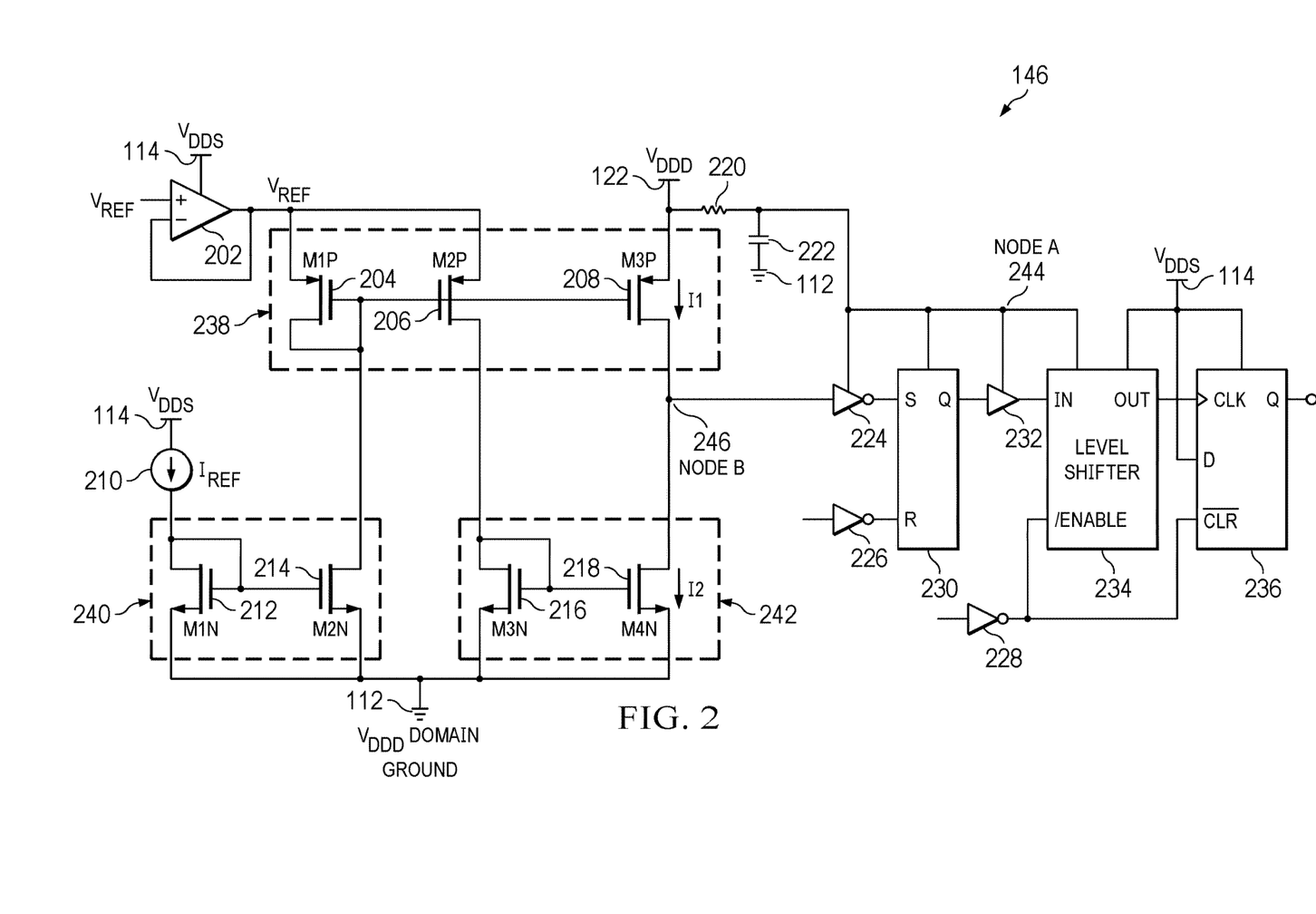
FIG. 2 is a circuit diagram of an example negative glitch detector.

FIG. 2 is a circuit diagram of an example negative glitch detector 146. The same reference numbers or other reference designators are used in the drawings to designate the same or similar (structurally and/or functionally) features. The negative glitch detector 146 includes $V_{DDS}$ 114, a differential amplifier 202, a first p-channel MOSFET (M1P) 204, a second p-channel MOSFET (M2P) 206, a third p-channel MOSFET (M3P) 208, a current source ($I_{REF}$) 210 providing a reference current $I_{REF}$, a first n-channel MOSFET (M1N) 212, a second n-channel MOSFET (M2N) 214, a third n-channel MOSFET (M3N) 216, a fourth n-channel MOSFET (M4N) 218, $V_{DDD}$ 122 and the $V_{DDD}$ domain ground 112, a resistor 220, a capacitor 222, a first inverter 224, a second inverter 226, a third inverter 228, an S-R latch 230, a buffer 232, a level shifter 234, and a D latch 236.

A noninverted input of the differential amplifier 202 is configured to receive a reference voltage $V_{REF}$. $V_{REF}$ is, for example, a bandgap reference voltage. In some examples, $V_{REF}$ is a voltage derived from a bandgap reference voltage, such as by using a resistive or capacitive voltage divider. $V_{REF}$ acts as a threshold voltage for detection of a negative glitch.

An inverted input of the differential amplifier 202 is connected to an output of the differential amplifier 202, a source of M1P 204, and a source of M2P 206. The differential amplifier 202 is powered by $V_{DDS}$ 114, so that the output of the differential amplifier 202 has the voltage $V_{REF}$ with a higher current than the noninverted input of the differential amplifier 202. In this way, the differential amplifier 202 acts as a buffer for the reference voltage $V_{REF}$, and in other examples, the differential amplifier 202 is supplemented or replaced by other buffer circuitry. Accordingly, the sources of M1P 204 and M2P 206 both receive the voltage $V_{REF}$.

A gate and a drain of M1P 204 are connected to a gate of M2P 206, a gate of M3P 208, and a drain of M2N 214. M1P 204, M2P 206, and M3P 208 are matched, meaning that they have the same current response, subject to a multiplier. The multiplier can be greater than, equal to, or less than one. Accordingly, M1P 204, M2P 206, and M3P 208 together form a first current mirror 238.

A first terminal of $I_{REF}$ 210 is connected to $V_{DDS}$ 114. A second terminal of $I_{REF}$ 210 is connected to a drain and a gate of M1N 212, and a gate of M2N 214. A source of M1N 212 is connected to a source of M2N 214, a source of M3N 216, a source of M4N 218, and the $V_{DDD}$ domain ground 112. M1N 212 and M2N 214 are matched. Accordingly, M1N 212 and M2N 214 together form a second current mirror 240.

A drain and a gate of M3N 216 are connected to a drain of M2P 206. A drain of M4N 218 is connected to a drain of M3P 208 and an input of the first inverter 224. M3N 216 and M4N 218 are matched. Accordingly, M3N 216 and M4N 218 form a third current mirror 242. The gate voltages of M1N 240, M2N 214, M3N 216, M4N 218, M1P 204, M2P 206, and M3P 208 are set by $I_{REF}$ as applied to the diode-connected transistors M1N 212, M3N 216, and M1P 204.

A source of M3P 208 is connected to $V_{DDD}$ 122 and a first terminal of the resistor 220. A second terminal of the resistor 220 is connected to a first terminal of the capacitor 222, a voltage input of the first inverter 224, a voltage input of the S-R latch 230, a voltage input of the buffer 232, and a first voltage input of the level shifter 234. A second terminal of the capacitor 222 is connected to the $V_{DDD}$ domain ground 112. Together, the resistor 220 and the capacitor 222 form a low pass filter that filters out short-duration transient variations in $V_{DDD}$ 122, such as negative voltage glitches. This enables devices connected to node A 244 to be powered by $V_{DDD}$ 122.

An output of the first inverter 224 is connected to a set(S) input of the S-R latch 230. An output of the second inverter 226 is connected to a reset (R) input of the S-R latch 230.

In an example, an input of the second inverter 226 is set to logical zero (in the $V_{DDD}$ voltage domain 124) on successful completion of a boot sequence of the MCU 104, such as a boot sequence completed without detecting a voltage glitch. Setting the input of the second inverter 226 to zero makes the output of the second inverter 226 a logical one. This triggers the reset function of the S-R latch 230, setting the latched value and output of the S-R latch 230 to zero. An output (Q) of the S-R latch 230 is connected to an input of the buffer 232.

An output of the buffer 232 is connected to a data input (IN) of the level shifter 234. An output of the third inverter 228 is connected to an/ENABLE (inverted enable) input of the level shifter 234 and a/CLR (inverted clear) input of the D latch 236. In an example, an input of the third inverter 228 is set to logical zero (in the $V_{DDS}$ voltage domain 116) on successful completion of a boot sequence of the MCU 104.

An output of the level shifter 234 is connected to a CLK input of the D latch 236. $V_{DDS}$ 114 is connected to a second voltage input of the level shifter 234 so that the level shifter 234 can shift from the $V_{DDD}$ voltage domain 122 at its input to the $V_{DDS}$ voltage domain 116 at its output. $V_{DDS}$ 114 is also connected to a voltage input of the D latch 236 and the data input (D) of the D latch 236. Accordingly, the data input of the D latch 236 receives a voltage corresponding to a logical one ($V_{DDS}$ 114); the D latch 236 does not store this logical one until its CLK input receives a rising edge (a voltage transition from low to high). An output (Q) of the D latch 236 is an output of the negative glitch detector 146, and indicates whether a negative glitch is detected.

The level shifter 234 produces an output signal with a logical value that is the same as a logical value of an input signal but over a different voltage range (e.g., between 0V and $V_{DDD}$ at the input and between 0V and $V_{DDS}$ at the output) so that the output signal is compatible with circuitry in another voltage domain. In this manner, the level shifter 234 enables output from the VGM 102 that indicates a voltage glitch (a voltage glitch indication) to be provided to the POR 132 or other security circuit in the $V_{DDS}$ voltage domain 116. Shifting the voltage glitch indication from the $V_{DDD}$ voltage domain 122 to the $V_{DDS}$ voltage domain 116 helps to protect the voltage glitch indication, and actions that may be taken in response thereto, against the external hostile interference that the voltage glitch indication signals may be present.

The level shifter 234 is enabled, and the D latch 236 is reset to store a logical zero, when the input of the third inverter 228 is a logical one. In some examples, the input of the third inverter 228 is configured to be a logical one after a successful boot sequence of the MCU 104.

The second current mirror 240 reflects $I_{REF}$ from a drain-source path of diode-connected M1N 212 to flow through a drain-source path of M2N 214 (with a first current multiplier dependent on parameters of M1N 212 and M2N 214) because M2N 214 has the same gate-source voltage ($V_{GS}$) as M1N 212. Similarly, the first current mirror 238 reflects $I_{REF}$ from a source-drain path of diode-connected M1P 204 to flow through a source-drain path of M2P 206 (with a second current multiplier dependent on parameters of M1P 204 and M2P 206) because M2P 206 has the same Vgs as M1P 204.

M3P 208 receives the same gate voltage as M1P 204, so that if M3P 208 has the same Vgs as M1P 204, M3P 208 will have the same source-drain current as M1P 204 (with a third current multiplier dependent on parameters of M1P 204 and M3P 208). However, the source voltage of M3P 208 is $V_{DDD}$ 122, rather than $V_{REF}$. During normal, non-glitched operation, $V_{DDD} > V_{REF}$. This means that during normal, non-glitched operation, M3P 208 has a more-negative $V_{GS}$ than M1P 204, so that a higher current flows through a source-drain path of M3P 208 than the $I_{REF}$ that flows through the source-drain path of M1P 204. The third current mirror 242 reflects $I_{REF}$ from a drain-source path of diode-connected M3N 216 to flow through a drain-source path of M4N 218 (with a fourth current multiplier dependent on parameters of M3N 216 and M4N 218) because M4N 218 has the same gate-source voltage ($V_{GS}$) as M3N 216.

A node B 246 is located between the drain of M3P 208, the drain of M4N 218, and the input of the first inverter 224. A first current I1 (mirrored from M1P 204) flows through the source-drain path of M3P 208 from $V_{DDD}$ 122 towards node B 246. I1 is dependent on factors including $I_{REF}$, $V_{REF}$, $V_{DDD}$ 122, and the first current multiplier (to current through M2N 214) times the third current multiplier (to current through M3P 208). A second current I2 (mirrored from M3N 216) flows through the drain-source path of M4N 218 away from node B 246 towards the $V_{DDD}$ domain ground 112. I2 is dependent on factors including $I_{REF}$, $V_{REF}$, and the first current multiplier (to current through M2N 214) times the second current multiplier (to current through M2P 206) times the fourth current multiplier (to current through M4N 218).

The first current multiplier (to current through M2N 214) times the third current multiplier (to current through M3P 208) can be equal to or different from the first current multiplier (to current through M2N 214) times the second current multiplier (to current through M2P 206) times the fourth current multiplier (to current through M4N 218). In other words, a total current multiplier from $I_{REF}$ 210 to I1 can be equal to or different from a total current multiplier from $I_{REF}$ 210 to I2. The total current multipliers are selected so that in normal, non-glitched operation, I1 is greater than I2 because the $V_{GS}$ of M3P 208 is greater than the $V_{GS}$ of M1P 204. I1 being greater than I2 causes the input of the first inverter 224 to charge, so that the input of the first inverter 224 is a logical one and the output of the first inverter 224 is a logical zero. A logical zero output of the first inverter 224 indicates normal, non-glitched $V_{DDD}$ 122. In some examples, the total current multipliers are also selected so that variation of a negative glitch detection threshold in response to variation of process, voltage, or temperature (PVT) is symmetrical around the negative glitch detection threshold set using $V_{REF}$ (as further discussed below).

If $V_{DDD}$ 122 glitches so that it equals $V_{REF}$, then I1 will equal I2 because the $V_{GS}$ of M3P 208 will equal the $V_{GS}$ of M1P 204. If $V_{DDD}$ 122 glitches so that it is less than $V_{REF}$, then I1 will be less than I2, and the input of the first inverter 224 will discharge. This will cause the input of the first inverter 224 to change from a voltage corresponding to a logical one to a voltage corresponding to a logical zero. Accordingly, a voltage at node B 246 corresponding to a logical one indicates that $V_{DDD} > V_{REF}$ (normal operation) so that I1>I2, and a voltage at node B 246 corresponding to a logical zero indicates that $V_{DDD} < V_{REF}$ (a negative glitch) so that I1<I2. Also, as noted above, $V_{REF}$ acts as a threshold voltage for detection of a negative glitch. This means that the detection threshold voltage can be adjusted by adjusting $V_{REF}$.

A logical zero at the input of the first inverter 224, representing a $V_{DDD}$ 112 glitch, means that the output of the first inverter 224, which provides the set input of the S-R latch 230, is a logical one. This causes the S-R latch 230 to latch and output a logical one, so that the data input of the level shifter 234 is a voltage corresponding to a logical one in the $V_{DDD}$ voltage domain 124. The level shifter 234 then outputs a voltage corresponding to a logical one in the $V_{DDS}$ voltage domain 116. The CLK input of the D latch 236 sees this change from logical zero to logical one as a rising clock edge. This causes the D latch 236 to latch, storing the logical one ($V_{DDS}$ 114) received by the data input of the D latch 236 in the $V_{DDS}$ voltage domain 116, isolated from voltage glitch injection attacks in the $V_{DDD}$ voltage domain 124. In some examples, an output of the D latch 236 indicating a negative glitch is stored in a memory (such as a non-volatile memory) in the $V_{DDS}$ voltage domain 116, and also the output of the D latch 236 triggers the POR 132 (and/or another security circuit) of the MCU 104.

In some examples, the negative glitch detector 146 is able to detect negative supply voltage glitches across a variety of PVT corners. The negative glitch detector 146 is resilient across PVT corners for several reasons, listed without limitation. First, the same $I_{REF}$ is used for programming the gate voltages of both M3P 208 and M4N 218, so the negative glitch detector 148 is resilient to variations of $I_{REF}$. Second, during a negative glitch, bulk voltages of the PMOS transistors will be approximately the same. Third, transient behavior does not depend on small signal parameters, such as rds (small signal drain-source resistance) of transistors.

In an example, $V_{REF}$ is 1.04 volts (V), and can vary ±50 milliVolts (mV). Temperature can vary from −40 Celsius (C) to 125 C. Normal $V_{DDD}$ is 1.28 V, the total current multiplier applied to each of I1 and I2 is sixteen, and the negative glitch detector 146 is able to detect negative supply voltage glitches with a duration of one nanosecond. In some examples, higher current multipliers increase sensitivity of the negative glitch detector 146, enabling faster glitch detection. In some examples, the first current multiplier (to current through M2N 214) is one, the second current multiplier (to current through M2P 206) is eight, the third current multiplier (to current through M3P 208) is twelve, and the fourth current multiplier (to current through M4N 218) is sixteen.

Various features of the negative glitch detector 146 enable the negative glitch detector 146 to respond more quickly to negative glitches. Some examples of such features are described, without limitation. First, $V_{DDD}$ 122 is capacitively coupled via the gate-source parasitic capacitance of M3P 208 to the gate of M3P 208. This means that as $V_{DDD}$ 122 decreases, the voltage at the gate of M2P 206 also decreases, increasing the current through M2P 206, which is reflected via M3N 216 in an increase in I2 (current through M4N 242), so that a negative glitch can be detected more quickly. Second, having a relatively small capacitance between the input voltage ($V_{DDD}$) 122) and the output voltage (node B 246, which is the input of the first inverter 224) enables the output voltage to respond more quickly to glitch voltages. In some examples, the capacitance between $V_{DDD}$ 122 and node B 246 is limited to a source-drain capacitance of M3P 208. Third, a change from normal $V_{DDD}$ 122 to a negative glitch voltage, and a change in voltage at node B 246 to indicate a negative glitch, have the same (negative) polarity. This enables a faster change in voltage at node B 246 to indicate the negative glitch.

Figure 3:
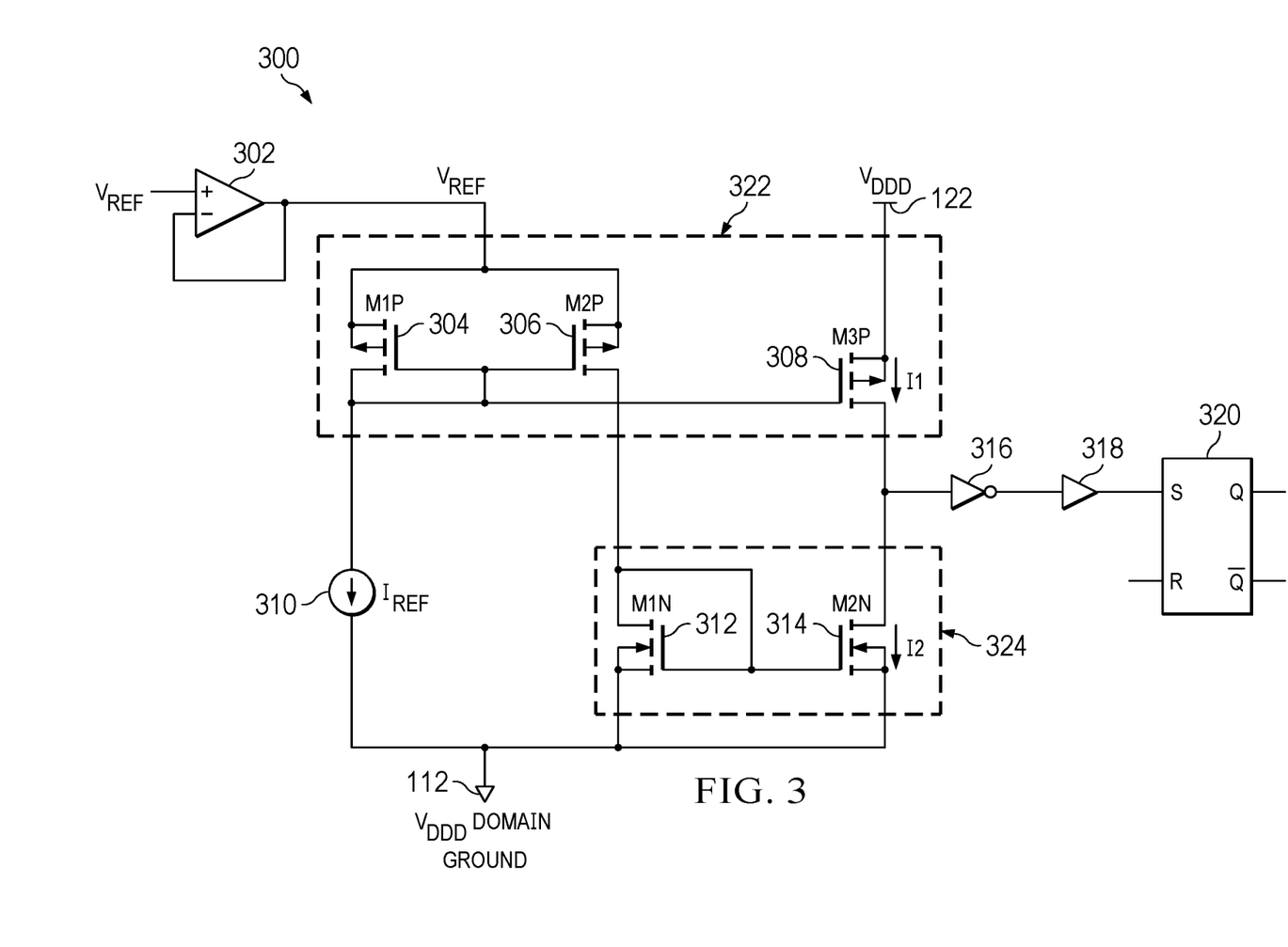
FIG. 3 is a circuit diagram providing an example alternative view of a portion of the negative voltage glitch detector of FIG. 2.

FIG. 3 is a circuit diagram providing an example alternative view 300 of a portion of the negative glitch detector 146 of FIG. 2. The alternative view 300 includes the $V_{DDD}$ domain ground 112 and $V_{DDD}$ 122, a differential amplifier 302, a first p-type enhancement MOSFET (M1P) 304, a second p-type enhancement MOSFET (M2P) 306, a third p-type enhancement MOSFET (M3P) 308, a current source ($I_{REF}$) 310 providing current $I_{REF}$, a first n-type enhancement MOSFET (M1N) 312, a second enhancement MOSFET (M2N) 314, an inverter 316, a buffer 318, and an S-R latch 320.

A noninverted input of the differential amplifier 302 is configured to receive the reference voltage $V_{REF}$. An inverted input of the differential amplifier 302 is connected to an output of the differential amplifier 302, a source of M1P 304, and a source of M2P 306. A gate and a drain of M1P 304 are connected to a gate of M2P 306, a gate of M3P 308, and a first terminal of $I_{REF}$ 310. M1P 304, M2P 306, and M3P 308 together form a first current mirror 322.

A second terminal of $I_{REF}$ 310 is connected to the $V_{DDD}$ domain ground 112, a source of M1N 312, and a source of M2N 314. A drain and a gate of M1N 312 are connected to a gate of M2N 314 and a drain of M2P 306. A drain of M2N 314 is connected to a drain of M3P 308 and an input of the first inverter 316. A source of M3P 308 is connected to $V_{DDD}$ 122. M1N 312 and M2N 314 together form a second current mirror 324.

An output of the first inverter 316 is connected to an input of the buffer 318. An output of the buffer 318 is connected to the set input of the S-R latch 320. The S-R latch 320 may be otherwise substantially similar to the S-R latch 230 of FIG. 2, and accordingly the output of the S-R latch 320 can be coupled to the input of buffer 232 of FIG. 2. $I_{REF}$ 310 and the second current mirror 324 can together be modeled as current source $I_{REF}$ 210 in place of M2N 314. Accordingly, operation of the alternative view 300 of the negative glitch detector 146 corresponds to operation of the negative glitch detector 146 as described with respect to FIG. 2.

Figure 4:
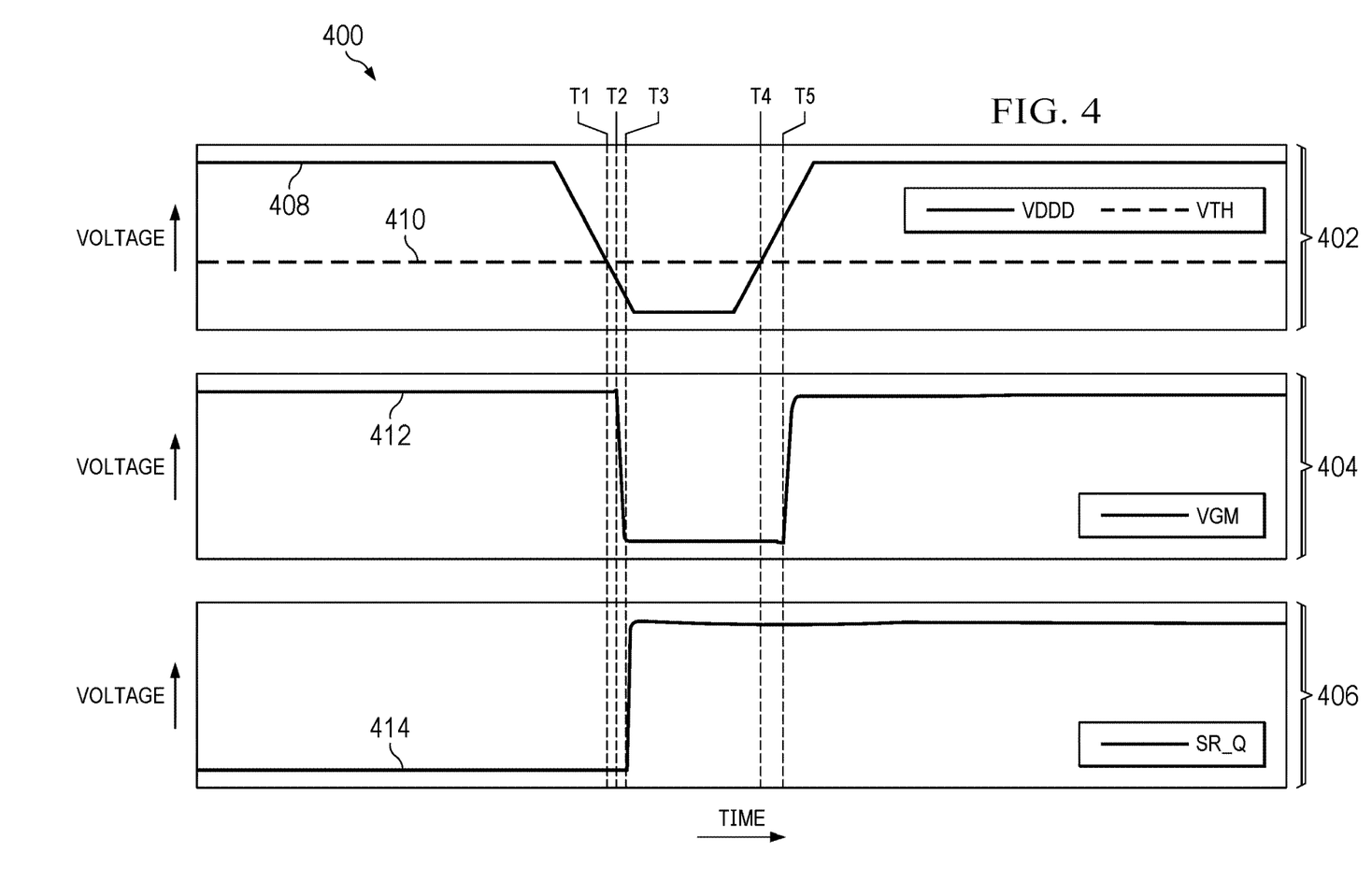
FIG. 4 is a set of graphs showing example signals in the negative glitch detector of FIG. 2.

FIG. 4 is a set of graphs 400 showing example signals in the negative glitch detector of FIG. 2. The set of graphs 400 includes a first graph 402, a second graph 404, and a third graph 406. The horizontal axis for each graph represents time, and the vertical axis for each graph represents voltage. The first graph 402 includes a $V_{DDD}$ curve 408 and a $V_{REF}$ curve 410. The second graph 404 includes a node B voltage curve 412. The third graph 406 includes an S-R latch output curve 414.

At T1, the $V_{DDD}$ curve 408 decreases below the constant level of the $V_{REF}$ curve 410, so that $V_{DDD}$ 122 has a negative glitch voltage. At T2, this makes I1<I2, which causes the node B voltage curve 412 to fall to a voltage corresponding to logical zero as the node discharges. At T3, the logical zero that the node B voltage curve 412 transitioned to at T2 propagates (as a logical one, via the first inverter 224) through the S-R latch 230, and the S-R latch output 414 transitions to a voltage corresponding to a logical one, indicating the negative glitch. At T4, the $V_{DDD}$ curve 408 rises above the $V_{REF}$ curve 410, returning to a normal voltage. At T5, $V_{DDD}$ 122 causes I1>I2, so that the node B voltage curve 412 returns to a level corresponding to logical one. In some examples, there is a delay between the $V_{DDD}$ curve 408 falling below the $V_{TH}$ curve 410 (the threshold voltage) at T4 and the node B voltage curve 412 returning to the level corresponding to logical zero at T5. In some examples, this delay relates to device capacitances or device response times (such as gate response times).

Figure 5:
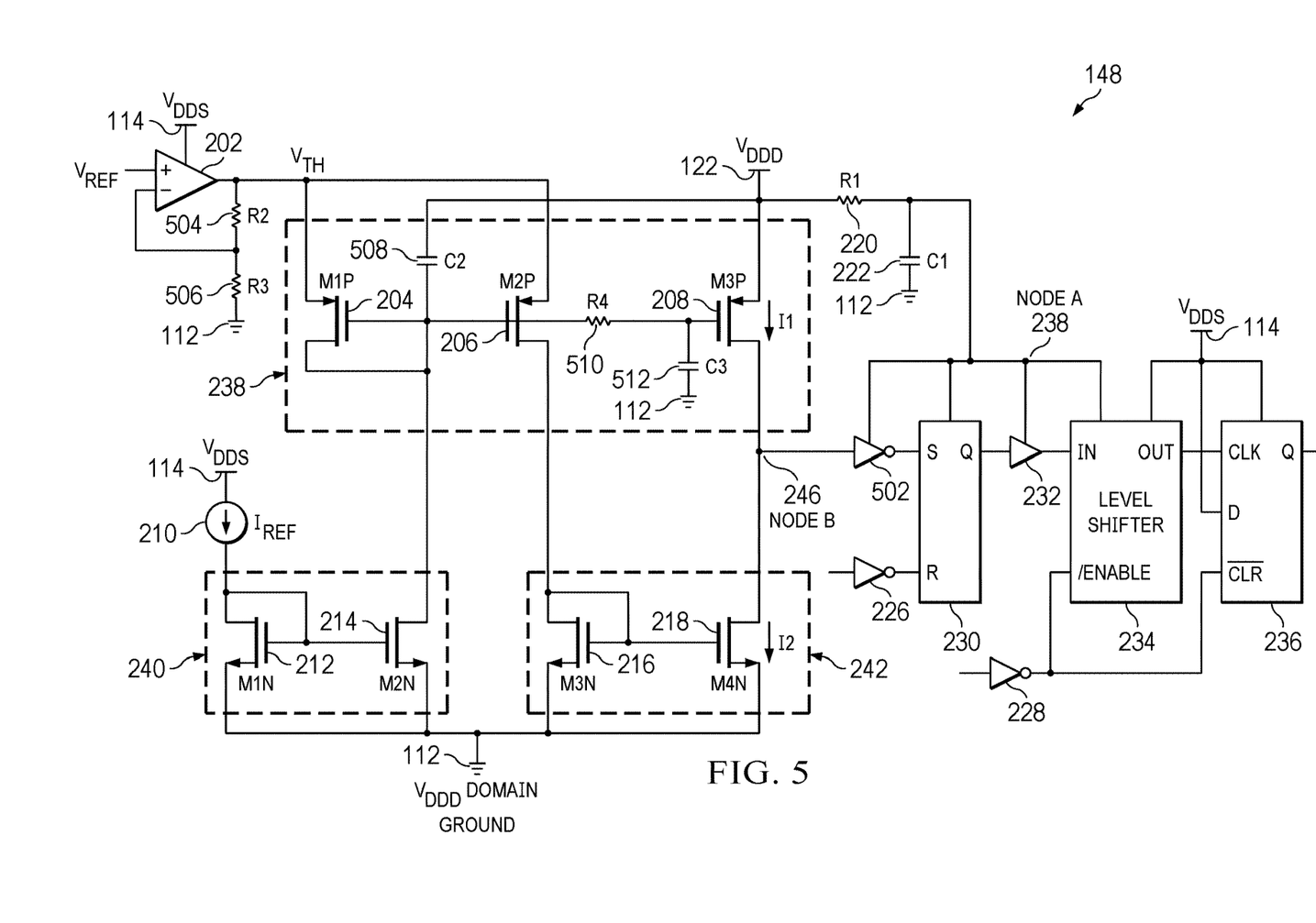
FIG. 5 is a circuit diagram of an example positive glitch detector.

FIG. 5 is a circuit diagram of an example positive glitch detector 148. The positive glitch detector 148 is similar to the negative glitch detector 146 of FIG. 2. The positive glitch detector 148 includes a buffer 502 instead of the first inverter 224, the resistor 220 is a first resistor (R1), and the capacitor 222 is a first capacitor (C1) 222. The positive glitch detector 148 further includes a second resistor (R2) 504, a third resistor (R3) 506, a second capacitor (C2) 508, a fourth resistor (R4) 510, and a third capacitor (C3) 512.

Note that the first current mirror 238 refers to M1P 204, M2P 206, and M3P 208 and the connections therebetween (as described with respect to FIG. 2); additional resistive and capacitive elements are incidentally included within the dotted box.

The output of the differential amplifier 202 is connected to a first terminal of R2 504, the source of M1P 204, and the source of M2P 206. The second terminal of the R2 504 is connected to the inverted input of the differential amplifier 202 and a first terminal of R3 506. A second terminal of R3 506 is connected to the $V_{DDD}$ domain ground 112. R2 504 and R3 506 together form a voltage divider, so that a threshold voltage $V_{TH}$ equals $V_{REF}$ multiplied by the resistance of R3 506, divided by the sum of the resistances of R2 504 and R3 506. The resistances of R2 504 and R3 506 are selected so that $V_{TH}$ is greater than a voltage of $V_{DDD}$ 122 during normal operation—that is, so that a voltage greater than $V_{TH}$ corresponds to a positive glitch. Accordingly, $V_{TH}$ acts as a threshold voltage for detection of a positive glitch.

The gate and drain of M1P 204 are connected to a first terminal of C2 508, the gate of M2P 206, and a first terminal of R4 510. A second terminal of C2 508 is connected to $V_{DDD}$ 122, the source of M3P 208, and the first terminal of R1 220. A second terminal of R4 510 is connected to a first terminal of C3 512 and the gate of M3P 208. A second terminal of C3 512 is connected to the $V_{DDD}$ domain ground 112.

Function of the first, second, and third current mirrors 238, 240, and 242 to generate currents I1 and I2 is similar to their function as described with respect to the negative glitch detector 146. If $V_{DDD}$<$V_{TH}$, corresponding to a normal operation voltage of $V_{DDD}$ 122, then I1<I2, an input of the first buffer 502 discharges (at node B 246), and the set input of the S-R latch 230 receives a voltage corresponding to a logical zero. If $V_{DDD}$>$V_{TH}$, corresponding to a positive glitch of $V_{DDD}$ 122, then I1>I2, an input of the first buffer 502 charges (at node B 246), the set input of the S-R latch 230 receives a voltage corresponding to a logical one, and the S-R latch 230 latches the logical one. The level shifter 234 shifts the resulting logical one output of the S-R latch 230 (via the second buffer 232) from the $V_{DDD}$ voltage domain 124 to the $V_{DDS}$ voltage domain 116. This causes the CLK input of the D latch 236 to see a rising edge, so that the D latch 236 latches and outputs the logical one. Accordingly, as stated above, $V_{TH}$ is a threshold voltage for indicating a positive glitch.

Without the RC circuit formed by R4 510 and C3 512, increased voltage from a positive glitch in $V_{DDD}$ 122 will be leak via source-gate capacitance of M3P 208 to the gate of M3P 208. Increased gate voltage of M3P 208 decreases I1 or causes I1 to increase more slowly. This makes the positive glitch detector 148 detect positive glitches more slowly and/or raises the effective $V_{DDD}$ 122 threshold voltage above which the positive glitch detector 148 indicates positive glitches. A resistance of R4 510 and a capacitance of C3 512 are selected so that the gate voltage of M3P 208 remains approximately constant during a positive glitch duration intended to be sufficient for detection by the positive glitch detector 148.

C2 508 capacitively couples $V_{DDD}$ 122 to the gate of M2P 206. When a positive glitch occurs, the voltage at the gate of M2P 206 increases due to charge leaking through C2 508, so that a source-drain current of M2P 206 decreases. This causes a gate voltage of M3N 216 to decrease, which causes I2 to decrease due to the third current mirror 242. (In some examples, this means that an effective positive glitch detection threshold voltage is less than $V_{TH}$. In some example, the effective threshold voltage is slightly less than $V_{TH}$, such as a few percent less than $V_{TH}$.) Accordingly, after a positive glitch begins, I1 becomes greater than I2 more quickly in response to a positive voltage glitch, meaning that C2 508 increases the response rate and sensitivity of the positive glitch detector 148.

In some examples, increasing the resistance of R4 510 and the capacitances of C2 508 and C3 512 can reduce a minimum glitch duration detectable by the positive glitch detector 148. In some examples, increasing the resistance of R4 510 and the capacitances of C2 508 and C3 512 increases a sensitivity of the voltage at node B 246 to PVT variation, which may reduce accuracy of the positive glitch detector 148. Accordingly, in some examples, the resistance of R4 510 and the capacitances of C2 508 and C3 512 are selected in response to a balance between detector response rate and detector accuracy.

Figure 6:
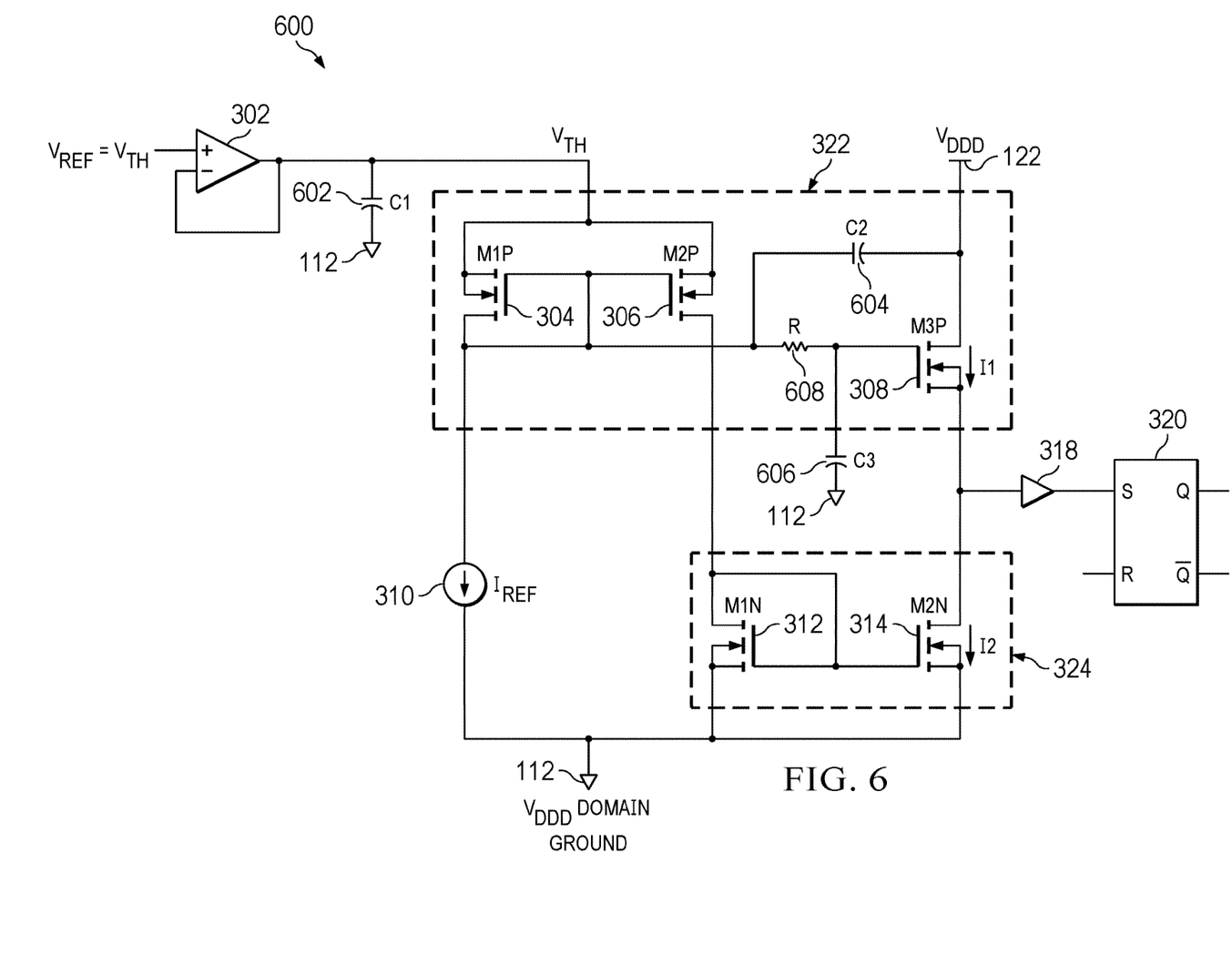
FIG. 6 is a circuit diagram providing an example alternative view of a portion of the positive glitch detector of FIG. 5.

FIG. 6 is a circuit diagram providing an example alternative view 600 of a portion of the positive glitch detector 148 of FIG. 5. The alternative view 600 of the portion of the positive glitch detector 148 is similar to the alternative view 300 of the portion of the negative glitch detector 146 (see FIG. 3). In the alternative view 600 of the positive glitch detector 148, $V_{REF}$ equals $V_{TH}$. The alternative view 600 also includes a first capacitor (C1) 602, a second capacitor (C2) 604, a third capacitor (C3) 606, and a resistor (R) 608. In some examples, C1 602, C2 604, and C3 606 are polarized capacitors; in some examples, they are a different type of capacitor.

The inverted input and the output of the differential amplifier 302 are connected to a first terminal of C1 602, the source of M1P 304, and the source of M2P 306. The gate and drain of M1P 304 are connected to the gate of M2P 306, a first terminal of $I_{REF}$ 310, a first terminal of C2 604, and a first terminal of R 608. A second terminal of C2 604 is connected to $V_{DDD}$ 122 and the source of M3P 308. A second terminal of R 608 is connected to a first terminal of C3 606 and the gate of M3P 308. A second terminal of C3 606 is connected to the $V_{DDD}$ domain ground 112. The drain of M3P 308 is connected to the drain of M2N 314 and to the input of the buffer 318—rather than being connected to the input of the buffer 318 via the inverter 316 (the inverter 316 is not included in the positive glitch detector 148 or its alternative view 600).

The output of buffer 318 is coupled to the set input of an S-R latch 320. The S-R latch 320 may be otherwise substantially similar to the S-R latch 230 of FIG. 5, and accordingly the output of the S-R latch 320 can be coupled to the input of buffer 232 of FIG. 5.

If $V_{DDD}$ 122>$V_{TH}$, then I1>I2. This causes the set input of the S-R latch 320 to go high, corresponding to a logical one. The non-inverted output of the S-R latch 320 also becomes a logical one, indicating a positive glitch.

Figure 7:
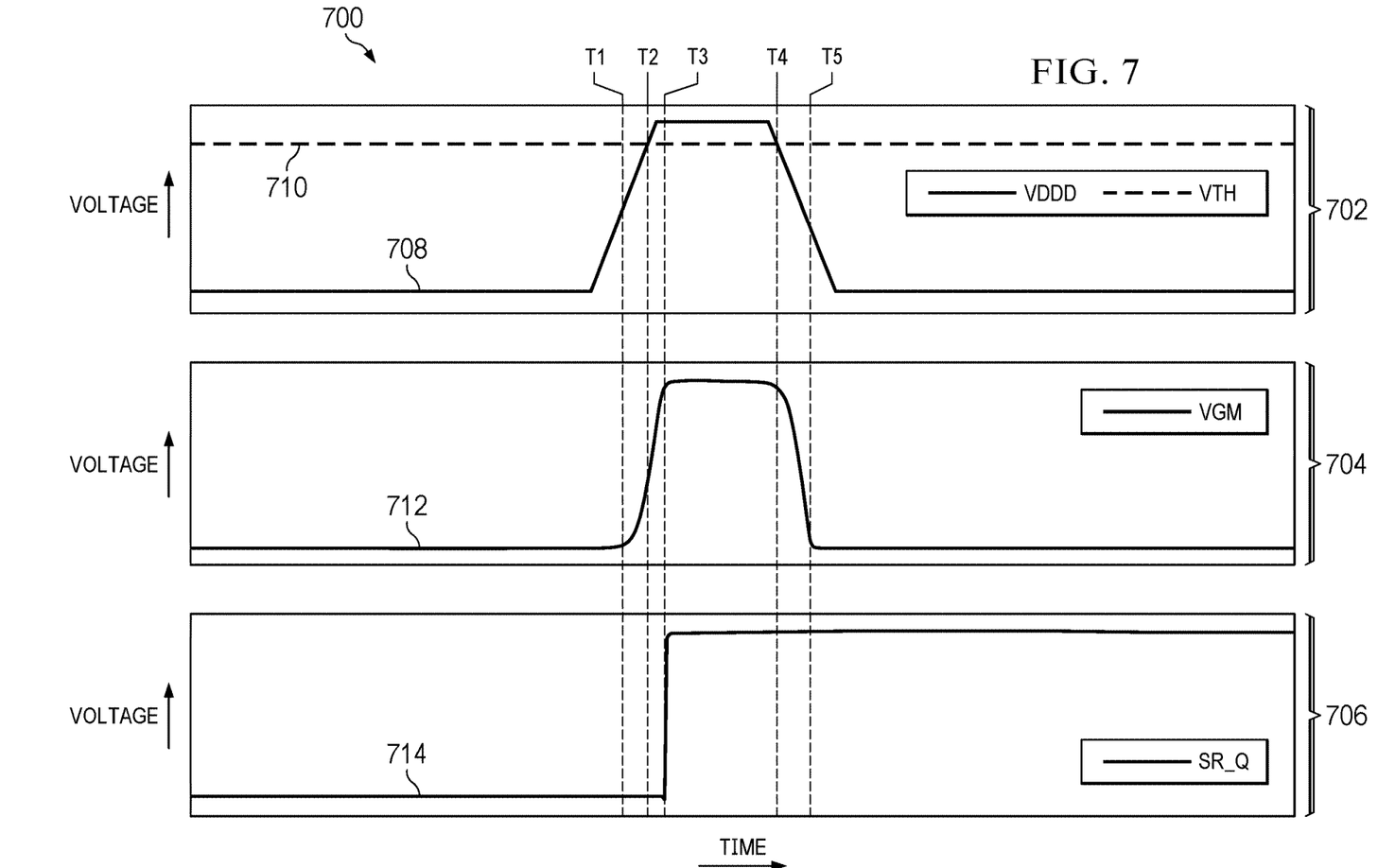
FIG. 7 is a set of graphs showing example signals in the positive glitch detector of FIG. 5.

FIG. 7 is a set of graphs showing example signals in the positive glitch detector of FIG. 5. The set of graphs 700 includes a first graph 702, a second graph 704, and a third graph 706. The horizontal axis for each graph represents time, and the vertical axis for each graph represents voltage. The first graph 702 includes a $V_{DDD}$ curve 708 and a $V_{TH}$ curve 710. The second graph 704 includes a node B voltage curve 712. The third graph 706 includes an S-R latch output curve 714.

At T1, the $V_{DDD}$ curve 708 increases above the level of an effective voltage glitch threshold (not shown), which is lower than $V_{TH}$ (as described above with respect to C2 508, R4 510, and C3 512). This makes I1>I2, which causes the node B voltage curve 712 to rise to a voltage corresponding to logical one as the node charges. At T2, the $V_{DDD}$ curve 708 increases above the constant level of the $V_{TH}$ curve 710. At T3, the logical one of the node B voltage curve 712 propagates through the S-R latch 230, and the S-R latch output curve 714 transitions to a voltage corresponding to a logical one, indicating the positive glitch. At T4, the $V_{DDD}$ curve 708 falls below the $V_{TH}$ curve 710, returning to a normal voltage. At T5, $V_{DDD}$ 122 causes I1<I2, so that the node B voltage curve 712 returns to a level corresponding to logical zero. In some examples, there is a delay between the $V_{DDD}$ curve 708 falling below the $V_{TH}$ curve 710 (the threshold voltage) at T4 and the node B voltage curve 712 returning to the level corresponding to logical zero at T5. In some examples, this delay relates to device capacitances or device response times (such as gate response times).

Modifications are possible in the described examples, and other examples are possible, within the scope of the claims.

In some examples, if a $V_{DDD}$ voltage is lower than an intended $V_{DDD}$ voltage, but is greater than a $V_{REF}$ used as a threshold voltage for a negative glitch, and this condition persists for a sufficient duration, then this condition corresponds to an error condition other than a negative glitch. In some examples, if a $V_{DDD}$ voltage is greater than an intended $V_{DDD}$ voltage, but is less than a $V_{TH}$ used as a threshold voltage for a positive glitch, and this condition persists for a sufficient duration, then this condition corresponds to an error condition other than a positive glitch. In other words, "normal operation" is used herein to refer to operation that does not indicate a negative glitch or positive glitch, and is not necessarily used to indicate error-free operation.

In some examples, the differential amplifier 202 is an amplifying reference buffer. In some examples, the reference voltage does not require amplification.

In some examples, $V_{DDR}$ 118 is used to power the differential amplifier 202 and the current source 210.

In some examples, $I_{REF}$ can be a positive temperature coefficient current (increasing current with increasing temperature), a constant current, or a negative temperature coefficient current (decreasing current with decreasing temperature).

In some examples, an input of a latch that can cause the latch to change state on receipt of a logical value transition (such as a rising or falling edge) or a constant logical value (for example, subject to a rising or falling edge, such as a clock edge, on a different input) can be referred to as a data input of the latch.

In some examples, the RC circuit corresponding to the resistor 220 and the capacitor 222 (R1 220 and C1 222) can be replaced with a low bandwidth voltage regulator or a buffer.

In some examples, a positive glitch detector 148 does not include C2 508, and/or R4 510 and C3 512.

In some examples, transistors other than MOSFETS are used.

In some examples, switches other than transistors are used.

In some examples, resistive elements other than resistors are used.

The term "couple" is used throughout the specification. The term may cover connections, communications, or signal paths that enable a functional relationship consistent with this description. For example, if device A provides a signal to control device B to perform an action, in a first example device A is coupled to device B, or in a second example device A is coupled to device B through intervening component C if intervening component C does not substantially alter the functional relationship between device A and device B such that device B is controlled by device A via the control signal provided by device A.

In this description, the term "and/or" (when used in a form such as A, B and/or C) refers to any combination or subset of A, B, C, such as: (a) A alone; (b) B alone; (c) C alone; (d) A with B; (e) A with C; (f) B with C; and (g) A with B and with C. Also, as used herein, the phrase "at least one of A or B" (or "at least one of A and B") refers to implementations including any of: (a) at least one A; (b) at least one B; and (c) at least one A and at least one B.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin", "ball" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors are described herein, other transistors (or equivalent devices) may be used instead with little or no change to the remaining circuitry. For example, a metal-oxide-silicon FET ("MOSFET") (such as an n-channel MOSFET, nMOSFET, or a p-channel MOSFET, pMOSFET), a bipolar junction transistor (BJT—e.g. NPN or PNP), insulated gate bipolar transistors (IGBTs), and/or junction field effect transistor (JFET) may be used in place of or in conjunction with the devices disclosed herein. The transistors may be depletion mode devices, drain-extended devices, enhancement mode devices, natural transistors or other type of device structure transistors. Furthermore, the devices may be implemented in/over a silicon substrate (Si), a silicon carbide substrate (SiC), a gallium nitride substrate (GaN) or a gallium arsenide substrate (GaAs).

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

While certain elements of the described examples may be included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means+/−10 percent of the stated value, or, if the value is zero, a reasonable range of values around zero. Modifications are possible in the described examples, and other examples are possible within the scope of the claims.

What is claimed is:

1. A voltage glitch detector comprising:
   a current source including first and second terminals;
   a latch including an input and an output;
   a first transistor including a source, a drain, and a gate;
   a second transistor including a source, a drain, and a gate;
   a third transistor including a source, a drain, and a gate, the source of the third transistor coupled to the source of the second transistor, and the gate and drain of the third transistor coupled to the gate of the first transistor, the gate of the second transistor, and the first terminal of the current source;
   a fourth transistor including a source, a drain, and a gate, the drain of the fourth transistor coupled to the drain of the first transistor and the input of the latch; and
   a fifth transistor including a source, a drain, and a gate, the source of the fifth transistor coupled to the source of the fourth transistor and the second terminal of the current source, and the gate and drain of the fifth transistor coupled to the gate of the fourth transistor and the drain of the second transistor.

2. The voltage glitch detector of claim 1, further comprising an inverter including an input and an output, the input of the inverter coupled to the drains of the first and fourth transistors, and the output of the inverter coupled to the input of the latch.

3. The voltage glitch detector of claim 1, further comprising:
   a first capacitor including first and second terminals, the first terminal of the first capacitor coupled to the source of the first transistor;
   a second capacitor including first and second terminals; and
   a resistor including first and second terminals, the first terminal of the resistor coupled to the gate and drain of the third transistor, the second terminal of the first capacitor, and the gate of the second transistor, and the second terminal of the resistor coupled to the first terminal of the second capacitor and the gate of the first transistor.

4. The voltage glitch detector of claim 1,
wherein the input of the latch is a data input, and the latch includes a power input;
the voltage glitch detector further comprising a filter including an input and an output, the input of the filter coupled to the source of the first transistor, and the output of the filter coupled to the power input of the latch.

5. The voltage glitch detector of claim 4,
wherein the latch is a first latch;
the voltage glitch detector further comprising:
   a second latch including an input and an output; and
   a level shifter including a data input, a first power input, a second power input, and an output, the data input of the level shifter coupled to the output of the first latch, the first power input of the level shifter coupled to the output of the filter, the output of the level shifter coupled to the input of the second latch.

6. The voltage glitch detector of claim 1,
wherein the current source is a first current source, the first current source including a sixth transistor and a seventh transistor, the sixth and seventh transistors each including a source, a drain, and a gate, the drain of the sixth transistor coupled to the first terminal of the first current source, and the sources of the sixth and seventh transistors coupled to the second terminal of the first current source;
the voltage glitch detector further comprising a second current source that includes a first terminal and a second terminal, the second terminal of the second current source coupled to the gate and drain of the seventh transistor and the gate of the sixth transistor.

7. The voltage glitch detector of claim 1, wherein the first, second, and third transistors are matched, and the fourth and fifth transistors are matched.

8. A voltage glitch detector comprising:
a latch including an input and an output;
a first transistor including a source, a drain, and a gate, a source-drain current of the first transistor responsive to a reference current and a comparison between a reference voltage and a voltage at a source of the first transistor; and
a second transistor including a source, a drain, and a gate, the drain of the first transistor coupled to the drain of the second transistor and the input of the latch, a drain-source current of the second transistor responsive to the reference current;
wherein the input of the latch is configured to have a voltage responsive to a polarity of a difference between the source-drain current of the first transistor and the drain-source current of the second transistor.

9. The voltage glitch detector of claim 8,
wherein the source of the first transistor is adapted to be coupled to a voltage source providing a source voltage; and
wherein the source of the second transistor is adapted to be coupled to a ground.

10. The voltage glitch detector of claim 9,
further comprising an inverter coupled between the drains of the first and second transistors and the input of the latch;
wherein the reference voltage is a lower voltage than the source voltage; and
wherein the voltage glitch detector is configured to detect a negative glitch.

11. The voltage glitch detector of claim 9, wherein the reference voltage is a higher voltage than the source voltage and the voltage glitch detector is configured to detect a positive glitch.

12. A processing system comprising:
a security circuit configured to perform a security function;
a power source configured to provide a source voltage;
a processor coupled to the power source;
a voltage reference configured to provide a reference voltage;
a voltage glitch detector including:
   a current source including first and second terminals;
   a latch including an input and an output, the output of the latch coupled to the security circuit;
   a first transistor including a source, a drain, and a gate, the source of the first transistor coupled to the power source;
   a second transistor including a source, a drain, and a gate;
   a third transistor including a source, a drain, and a gate, the voltage reference coupled to the source of the third transistor and the source of the second transistor, and the gate and drain of the third transistor coupled to the gate of the first transistor, the gate of the second transistor, and the first terminal of the current source;
   a fourth transistor including a source, a drain, and a gate, the drain of the fourth transistor coupled to the drain of the first transistor and the input of the latch; and
   a fifth transistor including a source, a drain, and a gate, the source of the fifth transistor coupled to the source of the fourth transistor and the second terminal of the current source, and the gate and drain of the fifth transistor coupled to the gate of the fourth transistor and the drain of the second transistor.

13. The processing system of claim 12, wherein the security circuit includes a power on reset circuit.

14. The processing system of claim 12, wherein the security circuit and the voltage glitch detector are located in separate voltage domains that are electrically isolated from each other.

15. The voltage glitch detector of claim 12, further comprising an inverter including an input and an output, the input of the inverter coupled to the drains of the first and fourth transistors, and the output of the inverter coupled to the input of the latch.

16. The voltage glitch detector of claim 12, further comprising:
a first capacitor including first and second terminals, the first terminal of the first capacitor coupled to the source of the first transistor;
a second capacitor including first and second terminals; and
a resistor including first and second terminals, the first terminal of the resistor coupled to the gate and drain of the third transistor, the second terminal of the first capacitor, and the gate of the second transistor, and the second terminal of the resistor coupled to the first terminal of the second capacitor and the gate of the first transistor.

17. The voltage glitch detector of claim 12,
wherein the input of the latch is a data input, and the latch includes a power input;

the voltage glitch detector further comprising a filter including an input and an output, the input of the filter coupled to the source of the first transistor, and the output of the filter coupled to the power input of the latch.

18. The voltage glitch detector of claim 17,
wherein the latch is a first latch;
the voltage glitch detector further comprising:
  a second latch including an input and an output; and
  a level shifter including a data input, a first power input, a second power input, and an output, the data input of the level shifter coupled to the output of the first latch, the first power input of the level shifter coupled to the output of the filter, the output of the level shifter coupled to the input of the second latch.

19. The voltage glitch detector of claim 12,
wherein the current source is a first current source, the first current source including a sixth transistor and a seventh transistor, the sixth and seventh transistors each including a source, a drain, and a gate, the drain of the sixth transistor coupled to the first terminal of the first current source, and the sources of the sixth and seventh transistors coupled to the second terminal of the first current source;
the voltage glitch detector further comprising a second current source that includes a first terminal and a second terminal, the second terminal of the second current source coupled to the gate and drain of the seventh transistor and the gate of the sixth transistor.

20. The voltage glitch detector of claim 12, wherein the first, second, and third transistors are matched, and the fourth and fifth transistors are matched.

\* \* \* \* \*